United States Patent [19]
Koller et al.

[11] 4,093,990
[45] June 6, 1978

[54] METHOD FOR THE PRODUCTION OF MASK PATTERNS FOR INTEGRATED SEMICONDUCTOR CIRCUITS

[75] Inventors: Konrad Koller; Ulrich Lauther, both of Munich, Germany

[73] Assignee: Siemens Aktiengesellschaft, Berlin & Munich, Germany

[21] Appl. No.: 615,357

[22] Filed: Sep. 22, 1975

[30] Foreign Application Priority Data

Sep. 23, 1974  Germany .............................. 2445368

[51] Int. Cl.² ........................ G06F 15/20; H05K 1/04
[52] U.S. Cl. .................................... 364/520; 364/491
[58] Field of Search ...................... 235/151.31, 151.21, 235/151, 150; 444/1; 340/172.5; 29/577

[56] References Cited

U.S. PATENT DOCUMENTS

| | | | |
|---|---|---|---|
| T940,020 | 11/1975 | Brechling, et al. | 235/151 X |
| 3,603,771 | 9/1971 | Isett, et al. | 235/151 |
| 3,617,714 | 11/1971 | Kernighan, et al. | 235/150 |
| 3,621,208 | 11/1971 | Isett, et al. | 235/150 |
| 3,654,615 | 4/1972 | Freitag | 340/172.5 |
| 3,681,782 | 8/1972 | Scanlon | 444/1 |
| 3,684,871 | 8/1972 | Schaffner | 235/150 |
| 3,701,112 | 10/1972 | Hagelbarger | 444/1 |

OTHER PUBLICATIONS

Graphical Layout System for IC Mask Design; J. S. Zucker & A. J. Crawford; IEEE Transactions on Circuit Theory, Vol. CT14 18, No. 1, Jan. 1971, pp. 163–173.

*Primary Examiner*—Edward J. Wise
*Attorney, Agent, or Firm*—Hill, Gross, Simpson, Van Santen, Steadman, Chiara & Simpson

[57] ABSTRACT

A method for the production of mask patterns for integrated semiconductor circuits composed of standard cells, such as gates, flip-flops, shift registers and the like, in which the cells are first grouped in a predeterminable number of cell groups in such a way that as few connections as possible extend between the groups and the space requirement of the individual groups is equal. Then, the cells forming a group are located in such a way that their wiring is possible upon as few wiring levels as possible so that the path of the connection lines is obtained and the resulting values are used for controlling an automatic drawing device for producing the mask patterns.

6 Claims, 3 Drawing Figures

METHOD FOR THE PRODUCTION OF MASK PATTERNS FOR INTEGRATED SEMICONDUCTOR CIRCUITS

BACKGROUND OF THE INVENTION

1. Field of the Invention

The present invention relates to a method for producing mask patterns for integrated semiconductor circuits which are divided into groups of standard cells, such as gates, flip-flops, shift registers and the like.

2. Description of the Prior Art

In the production of mask patterns for integrated semiconductor circuits it is desired to place the individual cells of the semiconductor circuits in such a way that as small a chip surface as possible will be required. This means that the wiring surface must be made as small as possible. Since the surface requirement of the wiring strongly depends on the arrangement of the cells, care must be taken to locate the cells in a corresponding optimum manner.

The mask patterns are produced while using an automatic drafting device. This drafting device draws the mask patterns which are then used as photo masks during the production of integrated semiconductor circuits, after having been decreased in size.

Heretofore, branch-and-bound algorithms, have been used as an aid in determining wiring paths. Connection lines have also been laid out in accordance with methods described by Kerninghan, Schweikert and Persky in their essay "An Optimum Channel-Routing Algorithm For Polycell Layouts Of Integrated Circuits", Proc. 10th Design Automation Workshop (1973), Pages 50-59, and Hashimoto and Stevens in their essay "Wire Routing By Optimizing Channel Assignment Within Large Apertures", Proc. 8th Design Automation Workshop (1971) Pages 155-169, each of these publications being fully incorporated herein by this reference.

SUMMARY OF THE INVENTION

Therefore, the present invention is based on the object of providing a method for the production of mask patterns for integrated semiconductor circuits of individual standard cells whereby an automatic drafting machine which is used for producing the mask patterns is controlled in such a way that as small a chip surface as possible is required for locating a given semiconductor circuit.

According to the invention, this object is realized in that the standard cells are first of all comprised into a given number of cell groups in such a way that as few connections extend between the groups as possible, and the space requirement of the individual groups is equal, and that then the standard cells forming groups are located in such a manner that their wiring is possible on as few wiring levels as possible. Thereafter, the path of the connection lines is obtained and the resulting values are used for the control of an automatic drafting machine for producing mask patterns. This, in particular, will provide that a loading of the output of the cell groups, due to intermediate group connections, is avoided to such an extent that the lines extending from a group determine the number of required wiring levels. In this manner, the wiring is better subdivided onto the entire wiring surface, and wiring concentrations at the line ends are avoided. Furthermore, spaces at the group ends which entail unused chip surfaces are avoided.

BRIEF DESCRIPTION OF THE DRAWINGS

Other objects, features and advantages of the invention, its organization and operation will be best understood from the following detailed description taken in conjunction with the accompanying drawings, on which.

DESCRIPTION OF THE PREFERRED EMBODIMENTS

Figure 1:
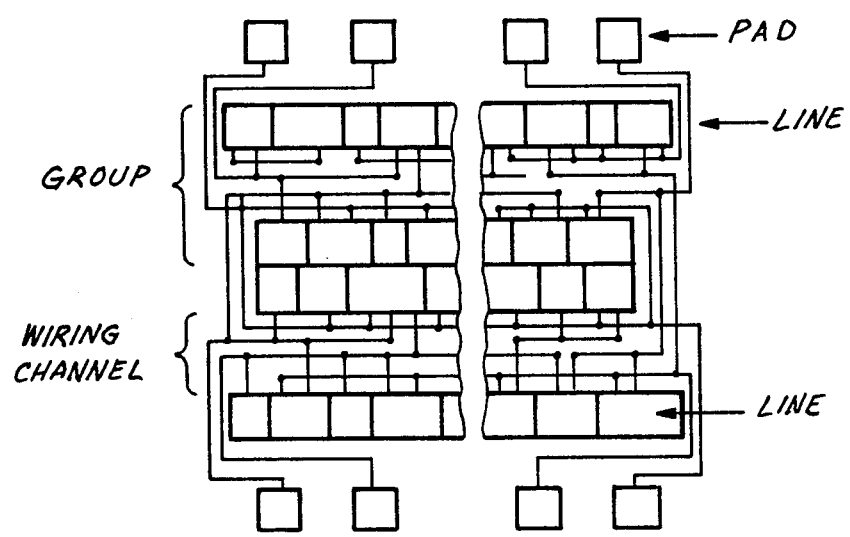
FIG. 1 is a schematic diagram of the topological structure of a standard cell circuit, the cells being topologically previously designed structures having parameters and functions (gate, flip-flop, shift register) which are cataloged, the cells having the same dimension in one direction with their inputs and outputs located along one broad side thereof.
Figure 2:
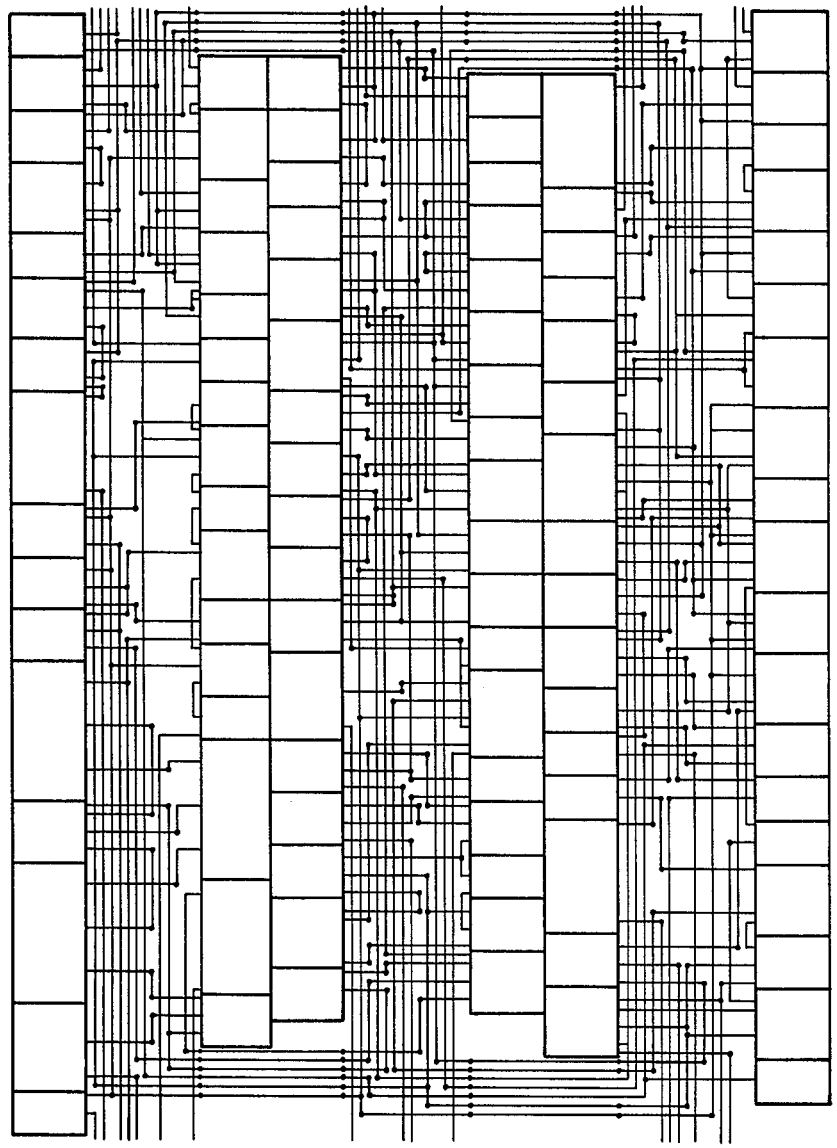
FIG. 2 is a schematic circuit layout for an integrated circuit obtained in accordance with the invention.

Referring to FIG. 1, the individual cells, such as gates, flip-flops, shift registers and the like are illustrated in block form as having equal vertical dimensions, as viewed in FIG. 1. It is also apparent that all input and output connections for a cell appear on one side thereof. The cells are aligned in rows or lines with two rows having a wiring channel therebetween. Two lines of cells, together with the intermediate wiring channel, form a group. The circuit can be composed of several groups and the pads are arranged at the margins of the circuit. A similar circuit is illustrated in FIG. 2 for a much greater number of cells.

With the structure of FIGS. 1 and 2 in mind, and referring through the following description to the flow chart of FIG. 3, the invention is organized and realized as follows.

The grouping of standard cells into cell groups may preferably be effected in such a way that a desired cell is assigned to a group and that thereafter a cell having a linkage number $v_j$ of the highest value is assigned to that group, followed by the cell with the next highest linkage number, and so on, where the linkage number $v_j$ is defined by the relationship $$v_j = \frac{\sum_{i=1}^{n} \frac{\delta_i G_i}{m_i}}{\sum_{i=1}^{n} G_i}$$

where $n$ is the number of the connections to a cell $j$, $\delta_i$ is equal to 1 when a connection exists from a contact point $i$ at a cell $j$ to the previously assigned cells and is equal to 0 when no such connection exists, $G_i$ is the weight of the potential path ending at the terminal $i$, and $m_i$ is the number of the ends of the potential path. Until the sum of the widths of the assigned cells and the space requirement of the lines which extend from a group exceed a boundary L (in the horizontal direction in FIG. 1), the cell with the largest $v_j$ is respectively assigned continuously after the realization of the linkage numbers $v_j$; thereafter, cells will be assigned to the next group, etc.

Obtaining the linkage number $v_j$ and the number of lines which leave a group is a simple operation if an activity $a_i$ is assigned to each potential path $i$. At the beginning of the method, all activities are placed at zero. After a cell is assigned, the activity $a_i$ is increased by one in all potential paths which end at that cell. If $a_i = 1$ in this manner, the linkage number must be increased in all cells connected to this potential path, and the respective potential path must be considered to leave the group. If, on the other hand, a potential path reaches the activity $m_i$, it will end in the group treated shortly before.

The size of the boundary value L is determined in a systematic variation and iterative repetition of the assignment process in such a way that groups of equal space requirement are produced. Since the value L does not have an influence on the assignment succession of the cells, the calculation of linkage numbers and potential path activities must only be carried out during the first passage when thereby the assignment succession and the change of the number of intermediate group connections is recorded after each assignment and is used during the following passages. The consideration of group provisions for individual cells can be easily worked into the given algorithms.

After locating the cells within a cell group, the search for an optimum space can be essentially accelerated when, first of all, the area is obtained within a cell group which is covered by the potential paths proceeding from the cell to be located, and the cell is located within this area provided that this location will result in the smallest addition to the entire wiring length in the longitudinal direction. In addition to the suitable location, the optimum insertion position must be determined.

During this initial locating of the cell, only the connections to previously placed cells can be taken into consideration. For this reason, a subsequent correction of the location assignment is required. For this purpose, each cell is removed once and relocated into the now most favorable location. Differing from the initial locating, the sequence of the cell placement in this adjustment depends on the entire length of all potential paths ending at a cell.

Each potential path which is not positioned within a group contains $k$ group internal partial potential paths and $k - 1$ paths which interconnect the partial potential paths upon the right and left side. The position of these is to be determined in such a way that the addition of wiring surface produced by way of guiding out the partial potential paths becomes a minimum. The entire potential path thus forms a comb-like or snake-like structure, or a mixture of both forms. If the position of the end of a potential path is described by a vector having elements which may assume the values zero (left terminal) or one (right terminal), then a 0-1 optimization problem of the dimension $k - 1$ will be obtained which may be solved without difficulties by way of branch and bound algorithms.

By introducing pseudo cells at the margins of the groups, the entire intermediate group wiring can be replaced by group internal connection. If a terminal ends within a group, the associated partial potential path is extended toward the corresponding pseudo cell. If a connection extends along a group, i.e. if no associated partial potential path leads into the group, a partial potential path is produced within the group which connects the marginally located pseudo cells.

The lines to the pads are treated similar as the intermediate group connections. The connection lines are extended toward pseudo cells on the left or right, depending on which direction is more favorable for minimizing the line length and for an even distribution of the pads on both halves of the chip.

Due to the intermediate group connections and contact lines, the former cell placement loses its optimum character. Therefore, correcting subsequent placement cycles are required as they have been described hereinabove.

In general, two subsequent placement cycles will suffice in order to obtain an arrangement which is optimum in a sense that a further improvement of the layout is not possible by cell relocation.

After locating the cells, the line guidance of the individual connection lines may be carried out in accordance with the prior art methods as described by Kerninghan et al and Hashimoto et al reference above.

The wiring is realized in two layers, while stressing the line guidance in the metal plane. Each potential path consists of a horizontal main path in the metal plane and branch lines perpendicular thereto which may deviate into the p-doped zone. Therefore, the entire wiring is essentially determined by the position of the main paths. When the main paths are assigned to the wiring levels, three requirements must be considered, and in the order of their importance these requirements are:

1. The main path levels are to be selected in such a way that all branch lines can be traced, if possible;
2. The main paths are to cover as few wiring levels as possible; and
3. The entire length of the branch lines is to be as small as possible.

If only the second requirement is considered, an accurate solution is obtained through the "left-edge" algorithm of Hashimoto and Stevens. The wiring levels are filled successively from left to right and from below to above, whereby that main path is respectively selected as the next one whose left corner has the smallest abscissa without contacting the previously assigned main paths.

The first requirement requires a modification of this algorithm. If two potential paths have a branch line on the same abscissa, the potential path whose branch line extends upwardly must be placed onto a higher wiring level than that path whose branch line is directed downwardly. If all pairs of branch lines of an equal abscissa and different potential are examined, a number of restrictions will be obtained which can be clearly illustrated by way of a directioned graph. Each node of the graph corresponds to a main path, each edge to a restriction. If there is an edge directed from node K1 to node K2, then the main path K1 is to be placed onto a higher level than the main path K2. If the restriction graph contains at least one cycle, then it is not possible to place all branch lines if the main wiring scheme—a main path per potential path—is to be maintained.

The "left edge" algorithm is now expanded in such a way that it is examined before each assignment of a main path to a level, whether this assignment is admissible, with the help of the restriction graph. If not, then the assignment succession must be changed with respect to this pure left edge algorithm. In order to obtain this in an optimum manner, a branch-and-bound method is applied.

The association of the main path to the wiring levels obtained in this manner is an optimum with respect to the required wiring levels and ability to realize the branch lines, but not with respect to the branch line lengths. In order to correspond to this third requirement, at least partially, all main paths—as far as this will agree with the restriction graph due to the wiring space which has remained free—are shifted in the direction of that cell wherein the majority of the associated branch lines end.

Figure 3:
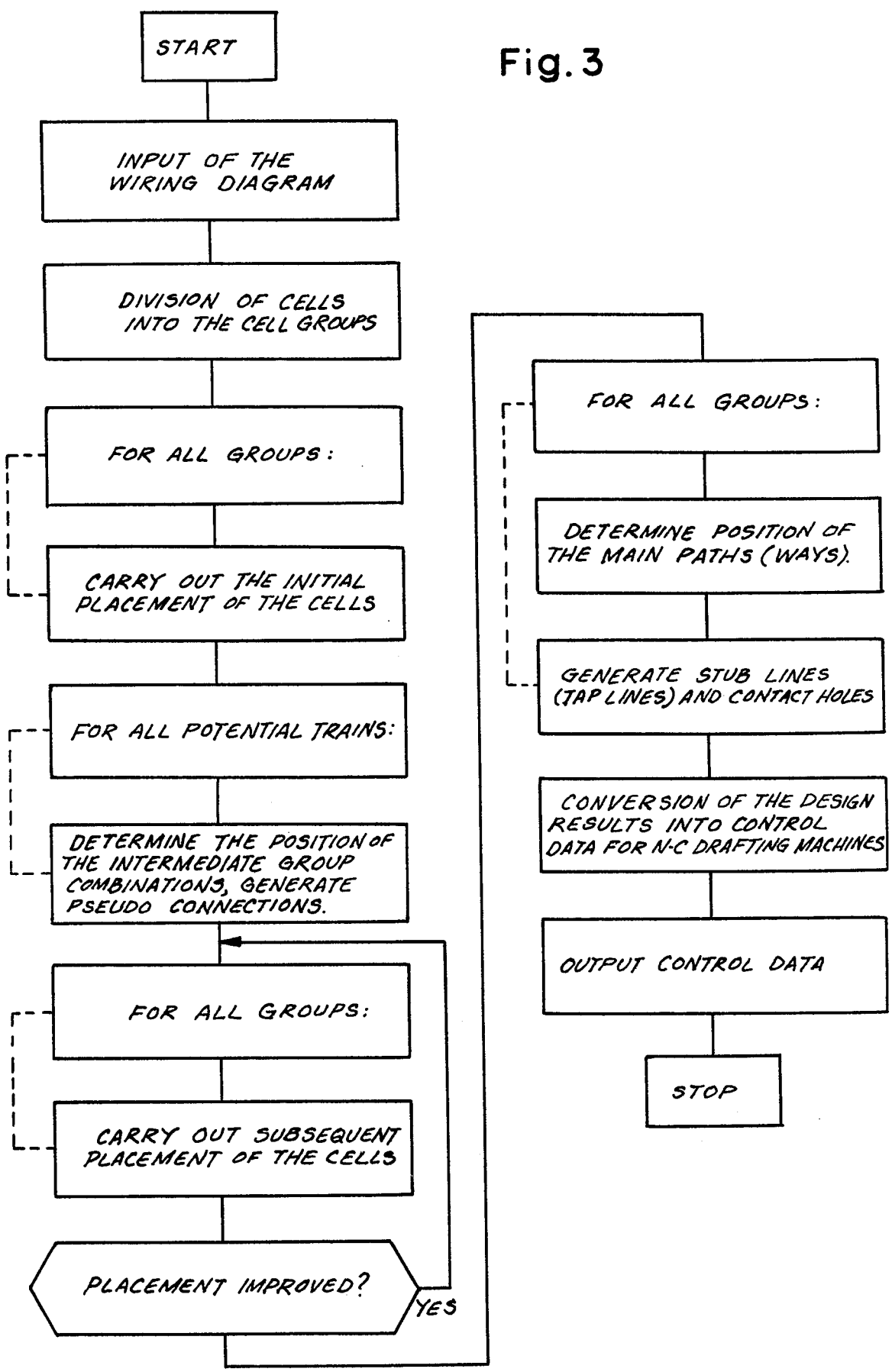
FIG. 3 is a flow chart which sets forth the steps one takes in practicing the invention.

Referring to the flow chart of FIG. 3, the process is initiated at the input of a wiring diagram after which the cells are comprised into groups. Following this, and for all groups, an initial placement of the cells is performed and, for all potential paths, intermediate group combinations and pseudo connections are generated. Next, and for all groups, a subsequent relocation of the cells is carried out for an improved placement.

Then, for all groups, the position of each main path is determined. Following this, the results of the design are converted into control data for numerically controlled drafting machines and the control data is output.

Although we have described our invention by reference to a particular embodiment thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A method for producing mask patterns for integrated semiconductor circuits, comprising:
   dividing a plurality of standard cells into a predetermined number of cell groups of equal space requirements with as few as possible connections required between groups;
   positioning each cell within its respective group to provide as few wiring levels as possible to obtain the paths of connection lines in co-ordinate terms;
   converting the co-ordinate terms to numerical control data which may be used by a numerically-controlled drafting machine;
   feeding the numerical control data to a numerically-controlled drafting machine; and
   drawing a mask with the drafting machine in response to receipt of the control data.

2. The method of claim 1, wherein the step of positioning each cell within its group comprises assigning a desired cell to the groups and continuously associating that cell whose linkage number $v_j$ is the greatest to the same group, wherein $$v_j = \frac{\sum_{i=1}^{n} \frac{\delta_i G_i}{m_i}}{\sum_{i=1}^{n} G_i}$$

where $n$ is the number of terminals at a cell $j$, $\delta_i$ is 1 when a connection exists to a previously assigned cell and is 0 when no such connection exists, $G_i$ is the weight of the potential path ending at the terminal $i$ and $m_i$ is the number of ends of the potential path.

3. The method of claim 2, comprising the step of obtaining cell linkage numbers by initially assigning an activity value of zero to each potential path of a circuit, then after cell assignment increasing the activity value by 1 for each potential path ending at this cell and increasing the linkage number $v_j$ of all cells connected to a potential path having an activity value of 1.

4. The method of claim 3, comprising the steps of: assigning cells in an alignment until the summation of cell dimensions in the direction of alignment and the space requirement of lines leaving a group exceeds a predetermined boundary value L by systematic variations and iterative repetition of the cell assignment process until groups of equal space requirement are formed.

5. The method of claim 4, wherein for locating the cells within a group only the area covered by potential paths, connected with this cell is considered, then the cell is placed in this area such that the smallest addition to the total wiring length in the longitudinal direction which is parallel to the direction of cell alignment results.

6. The method of claim 5, comprising the step of optimizing cell location by another iterative repetition of cell assignment.

* * * * *